(12) United States Patent
Frougier et al.

(10) Patent No.: US 11,444,238 B2
(45) Date of Patent: Sep. 13, 2022

(54) SCALABLE HEAT SINK AND MAGNETIC SHIELDING FOR HIGH DENSITY MRAM ARRAYS

(71) Applicant: International Business Machines Corporation, Armonk, NY (US)

(72) Inventors: Julien Frougier, Albany, NY (US); Ruilong Xie, Niskayuna, NY (US); Heng Wu, Guilderland, NY (US); Chen Zhang, Albany, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 16/874,002

(22) Filed: May 14, 2020

(65) Prior Publication Data
US 2021/0359197 A1   Nov. 18, 2021

(51) Int. Cl.
| | | |
|---|---|---|
| H01L 43/02 | (2006.01) | |
| H01L 27/22 | (2006.01) | |
| H01F 41/34 | (2006.01) | |
| H01L 43/12 | (2006.01) | |
| H01F 10/32 | (2006.01) | |
| G11C 11/16 | (2006.01) | |

(52) U.S. Cl.
CPC ............ *H01L 43/02* (2013.01); *G11C 11/161* (2013.01); *H01F 10/329* (2013.01); *H01F 41/34* (2013.01); *H01L 27/222* (2013.01); *H01L 43/12* (2013.01)

(58) Field of Classification Search
CPC ..... H01L 43/02; H01L 27/222; G11C 11/161; G11C 11/1695
See application file for complete search history.

(56) References Cited

U.S. PATENT DOCUMENTS

| | | |
|---|---|---|
| 7,829,980 B2 | 11/2010 | Molla et al. |
| 8,125,057 B2 | 2/2012 | Bonin et al. |
| 8,557,610 B2 | 10/2013 | Chen et al. |
| 9,024,399 B2 | 5/2015 | Guo |
| 9,564,403 B2 | 2/2017 | Allinger et al. |
| 10,096,768 B2 | 10/2018 | Jiang et al. |
| 10,186,308 B1 | 1/2019 | Guarisco et al. |
| 10,381,553 B2 | 8/2019 | Pinarbasi et al. |

(Continued)

OTHER PUBLICATIONS

Cai et al., High Performance MRAM with Spin-Transfer-Torque and Voltage-Controlled Magnetic Anisotropy Effects, Journal of Applied Sciences, vol. 7, Issue 9, Aug. 2017, pp. 1-13, MDPI.

(Continued)

*Primary Examiner* — Shih Tsun A Chou
(74) *Attorney, Agent, or Firm* — Daniel Morris; Otterstedt & Kammer PLLC

(57) ABSTRACT

A magnetic random access memory (MRAM) array includes a plurality of MRAM cells, each of the MRAM cells including a magnetic tunnel junction (MTJ) stack disposed on a bottom metal via connecting the MTJ stack to a bottom conductive contact in a substrate, a plurality of top conductive contacts, each of the top conductive contacts disposed on a respective one of the MTJ stacks, and a plurality of unitary structures configured as a heat sink/magnetic shield disposed on a vertical portions of each of the MRAM cells, including vertical portions of the bottom metal vias, and under a portion of each of the MTJ stacks.

12 Claims, 12 Drawing Sheets

(56) References Cited

U.S. PATENT DOCUMENTS

2013/0119496 A1* 5/2013 Zeng .................. H01L 43/12
257/E21.24
2019/0207083 A1 7/2019 Zhong et al.

OTHER PUBLICATIONS

Anonymous, STT-MRAM: Introduction and market status, https://www.mram-info.com/stt-mram, Feb. 2019, pp. 1-8.

* cited by examiner ated in middle-of-the-line (MOL) or back end of line (BEOL) processes. Scaling STT-MRAM devices technology down to 50 nm dimensions and beyond engenders technical problems including thermal stability, self-heating and switching disturbances. For example, the thermal stability of smaller MTJ devices needs to be improved since self-heating of the MTJ junction occurs during read/write cycles. Self-heating is expected to become a predominant problem as both Read/Write speed and pattern density increase. Some consequences of self-heating include: (i) reduction of switching current (positive impact), (ii) reduction of device thermal stability (negative impact), (iii) reduction of device reliability (negative impact). Another challenge includes minimizing the switching disturbance of MTJ devices caused by external magnetic fields and stray magnetic fields from neighboring devices. The magnetic interference generated by an external or local magnetic fields not only distort or change the spins within the MTJ device or bit, but also induce changes on electrical signals of the circuits. READ and WRITE operations in MTJ devices are inevitably affected by external or local magnetic fields. These cause reliability issues in MTJ devices.

SCALABLE HEAT SINK AND MAGNETIC SHIELDING FOR HIGH DENSITY MRAM ARRAYS

BACKGROUND

STT-MRAM (Spin-Transfer Torque Magnetoresistive Random-Access Memory) has been identified as a potential universal memory with potential markets extending from Flash replacement (MRAM-F) to SRAM replacement (MRAM-S). STT-MRAM is a type of MRAM device. STT-MRAM enables higher densities, low power consumption and reduced cost compared to regular or toggle MRAM devices.

In STT-MRAM devices, a Magnetic-Tunnel-Junction (MTJ) is formed by having magnetic (e.g., ferromagnetic) layers separated by an intermediary non-magnetic tunnel barrier layer. During operation, the magnetization orientation in the free layer of the MTJ is flipped using a spin-polarized electronic current via Spin-Transfer-Torque (STT) mechanism. The spin-polarization of the electronic current is generated by flowing the electrons though the magnetic Reference Layer (RL) exhibiting a fixed magnetization orientation. This spin-polarized electronic current subsequently flows through a magnetic Free Layer (FL) which changes the FL orientation of its magnetization through transfer of the spin angular momentum via Spin-Transfer-Torque (STT) mechanism.

Embedded STT-MRAM devices are typically integrated in middle-of-the-line (MOL) or back end of line (BEOL) processes. Scaling STT-MRAM devices technology down to 50 nm dimensions and beyond engenders technical problems including thermal stability, self-heating and switching disturbances. For example, the thermal stability of smaller MTJ devices needs to be improved since self-heating of the MTJ junction occurs during read/write cycles. Self-heating is expected to become a predominant problem as both Read/Write speed and pattern density increase. Some consequences of self-heating include: (i) reduction of switching current (positive impact), (ii) reduction of device thermal stability (negative impact), (iii) reduction of device reliability (negative impact). Another challenge includes minimizing the switching disturbance of MTJ devices caused by external magnetic fields and stray magnetic fields from neighboring devices. The magnetic interference generated by an external or local magnetic fields not only distort or change the spins within the MTJ device or bit, but also induce changes on electrical signals of the circuits. READ and WRITE operations in MTJ devices are inevitably affected by external or local magnetic fields. These cause reliability issues in MTJ devices.

In view of the foregoing, there is a need to provide reliable and cost effective processing of magnetic shielding techniques to protect the MTJ device or bit from external or local magnetic fields.

BRIEF SUMMARY

According to one or more embodiments of the present invention, a method of manufacturing a heat sink and magnetic shield for a magnetic random access memory (MRAM) array comprises depositing a blanket sacrificial layer on a substrate comprising bottom conductive contacts formed therein, depositing a dielectric layer on the blanket sacrificial layer, forming a bottom metal via in the blanket sacrificial layer and the dielectric layer, and contacting a top surface of the bottom conductive contacts, depositing a magnetic tunnel junction (MTJ) stack, depositing a hardmask on the MTJ stack, patterning the MTJ stack and the hardmask to form an MRAM device and expose the blanket sacrificial layer by etching the hardmask and the MTJ stack, encapsulating the MRAM device and the sacrificial material in a first conformal dielectric liner, removing the sacrificial material completely and horizontal portions of the first conformal dielectric liner, wherein vertical portions of the first conformal dielectric liner are not removed, depositing a conformal heat sink/magnetic shield material on the MRAM device the vertical portions of the first conformal dielectric liner, exposed sidewall portions of the bottom metal via and the substrate, and performing a directional etch removing an exposed upper portion of the conformal heat sink/magnetic shield material to form, simultaneously, a lateral and bottom heat sink/magnetic shield around a portion of the MRAM device.

According to one or more embodiments of the present invention, a magnetic random access memory (MRAM) array includes a plurality of MRAM cells, each of the MRAM cells including a magnetic tunnel junction (MTJ) stack disposed on a bottom metal via connecting the MTJ stack to a bottom conductive contact in a substrate, a plurality of top conductive contacts, each of the top conductive contacts disposed on a respective one of the MTJ stacks, and a plurality of unitary structures configured as a heat sink/magnetic shield disposed on a vertical portions of each of the MRAM cells, including vertical portions of the bottom metal vias, and under a portion of each of the MTJ stacks.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

an MRAM device comprising lateral and bottom heat sink/magnetic shields integrated at the device level providing improved protection from adverse thermal effects and magnetic fields; and an MRAM device comprising top, lateral and bottom heat sink/magnetic shields integrated at the device level providing improved protection from adverse thermal effects and magnetic fields.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

According to one or more embodiments of the present invention, the problems of self-heating, thermal stability and switching disturbances that can occur in STT-MRAM devices are simultaneously addressed by methods for manufacturing reliable and cost effective magnetic shielding to protect the MTJ device or bit of a STT-MRAM device from external or local magnetic fields.

According to some embodiments, MTJ devices are protected from adverse thermal effects, such as those resulting from self-heating induced by read/write operations. Such adverse thermal effect can include thermal stress within certain areas of the MTJ device. The heat generated during the Read/Write cycles of such an MTJ device can be dissipated away more quickly than occurs in an MTJ device fabricated using conventional methods. As a result, the MTJ device Read/Write reliability is improved.

According to some embodiments, STT-MRAM devices are protected from adverse switching effects, which can arise due to the magnetic fields of neighboring devices. Embodiments include magnetic shield structures and configurations that protect the MTJ stack from external or local magnetic fields. These magnetic shielding structures are applicable to MRAM chips based on MTJs with conventional in-plane and perpendicular magnetic designs as well as any other possible magnetic designs.

According to some embodiments, a method for manufacturing magnetic shielding to protect the MTJ device or bit of a STT-MRAM device simultaneously protects the MTJ devices from adverse thermal effects and protects the STT-MRAM devices from adverse switching effects, using a heat sink structure that simultaneously serves as a magnetic shield for MTJ devices.

Figure 1:
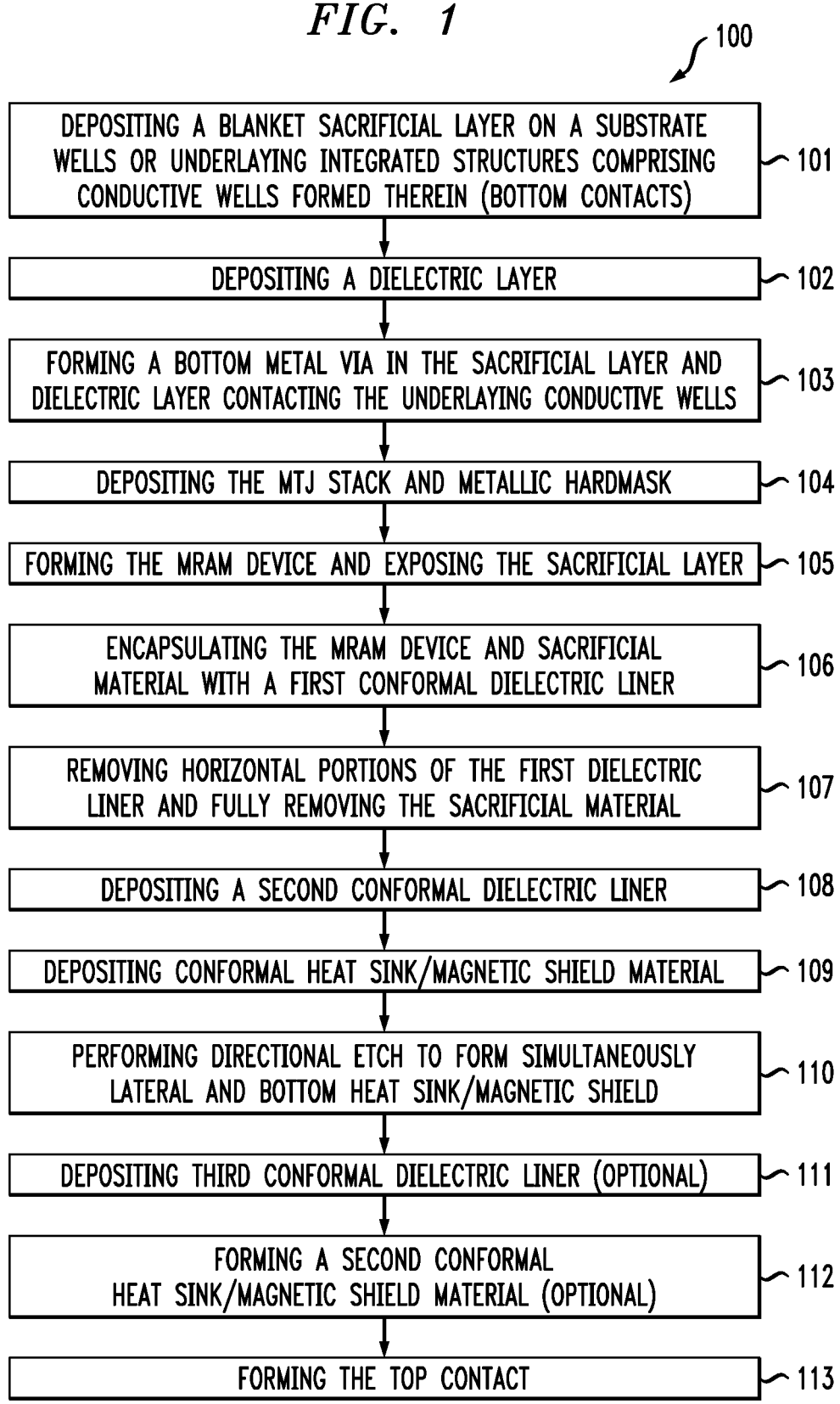
FIG. 1 is a flow diagram of a method of forming a scalable heat sink and magnetic shielding for high density MRAM arrays according to some embodiments of the present invention.

According to some embodiments of the present invention and FIG. 1, a method 100 for forming a scalable heat sink and magnetic shielding for high density MRAM arrays comprises, depositing a blanket sacrificial layer 101, depositing a dielectric layer 102, a forming that bottom metal via (MVia) 103, depositing the MTJ stack and a metallic hardmask 104, forming the MRAM device by Ion Beam Etching (IBE) 105, encapsulating the MRAM device and sacrificial material in a liner 106 (e.g., a silicon nitride liner), removing horizontal portions of the liner and the sacrificial material 107, depositing conformal dielectric liner 108, depositing conformal heat sink/magnetic shield material 109, performing directional etch to form, simultaneously, a lateral and bottom heat sink/magnetic shield 110, and forming the top contact 113. Blocks 111 and 112 can be optionally performed and are discussed in connection with FIG. 12.

According to one or more embodiments, the heat sink/magnetic shield is a unitary structure, formed simultaneously through the patterning of a heat sink and magnetic shield material.

Figure 2:
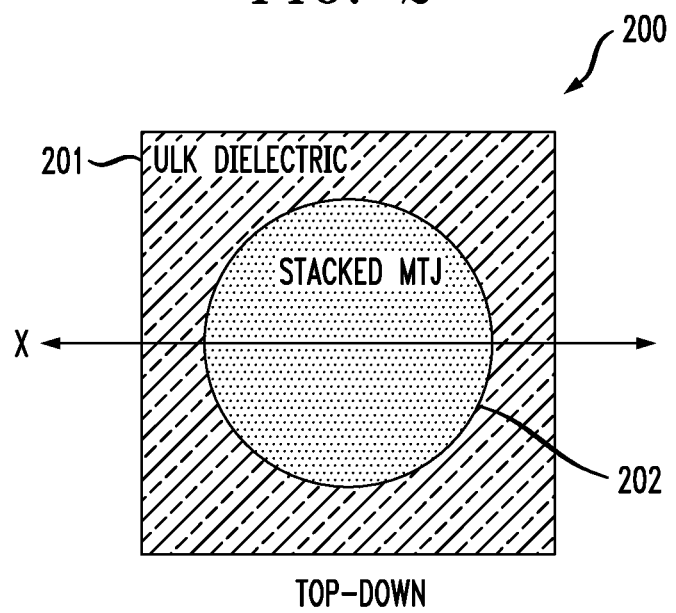
FIG. 2 is a top-down view of a device according to an exemplary embodiment of the present invention.
Figure 3:
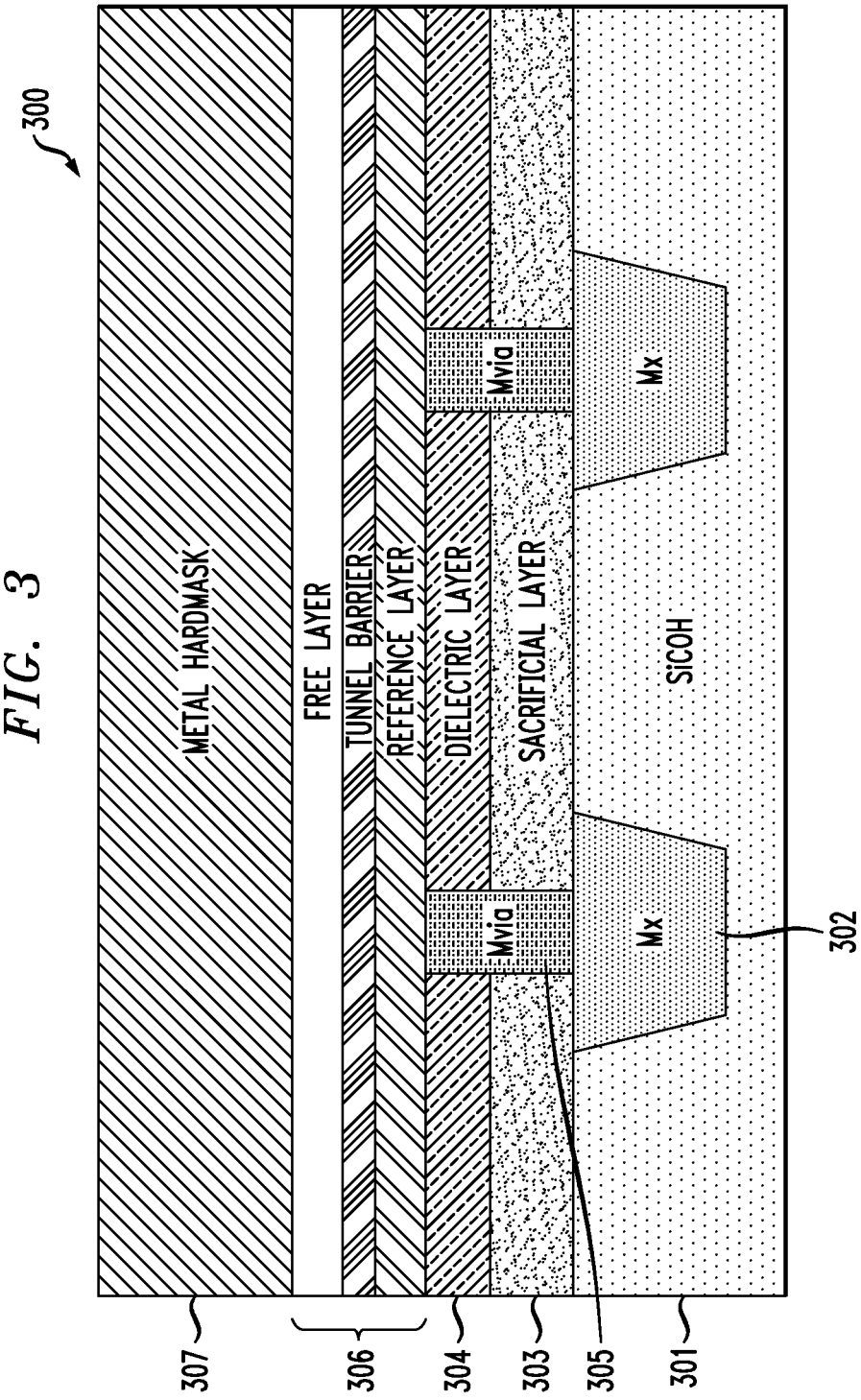
FIGS. 3-8 show intermediate structures according to some embodiments of the present invention.

According to some embodiments of the present invention and according to the method 100 shown in FIG. 1, the views found in FIGS. 3-12 are cross sections along X in FIG. 2. FIG. 2 is a top-down view of a device 200 (whereas FIGS. 3-12 are side-views along X), which includes an ultra-low dielectric constant (ULK) dielectric material 201 surrounding a stacked MTJ 202. FIG. 3 shows an intermediate structure 300 formed by providing a substrate 301, for example, a carbon doped oxide dielectric such as SiCOH, carrying integrated metal level-X (Mx) 302 (e.g., bottom conductive contacts formed of Cu, Ru, etc.), depositing a blanket sacrificial layer 303, for example, amorphous silicon (a-Si), amorphous silicon-germanium a-SiGe, etc., depositing a dielectric layer 304, forming a bottom metal via 305, e.g., titanium nitride (TiN), tantalum nitride (TaN) or tungsten (W), and depositing the MTJ stack layers 306 and metallic hardmask 307. The MTJ stack layers 306 include a reference layer (RL), a tunnel barrier (or barrier) and a free layer (FL). It should be understood that the substrate 301 can be an underlaying integrated structure (e.g., a wafer with fully integrated FEOL/MOL up to Mx could be the incoming structure), or the like.

Figure 4:
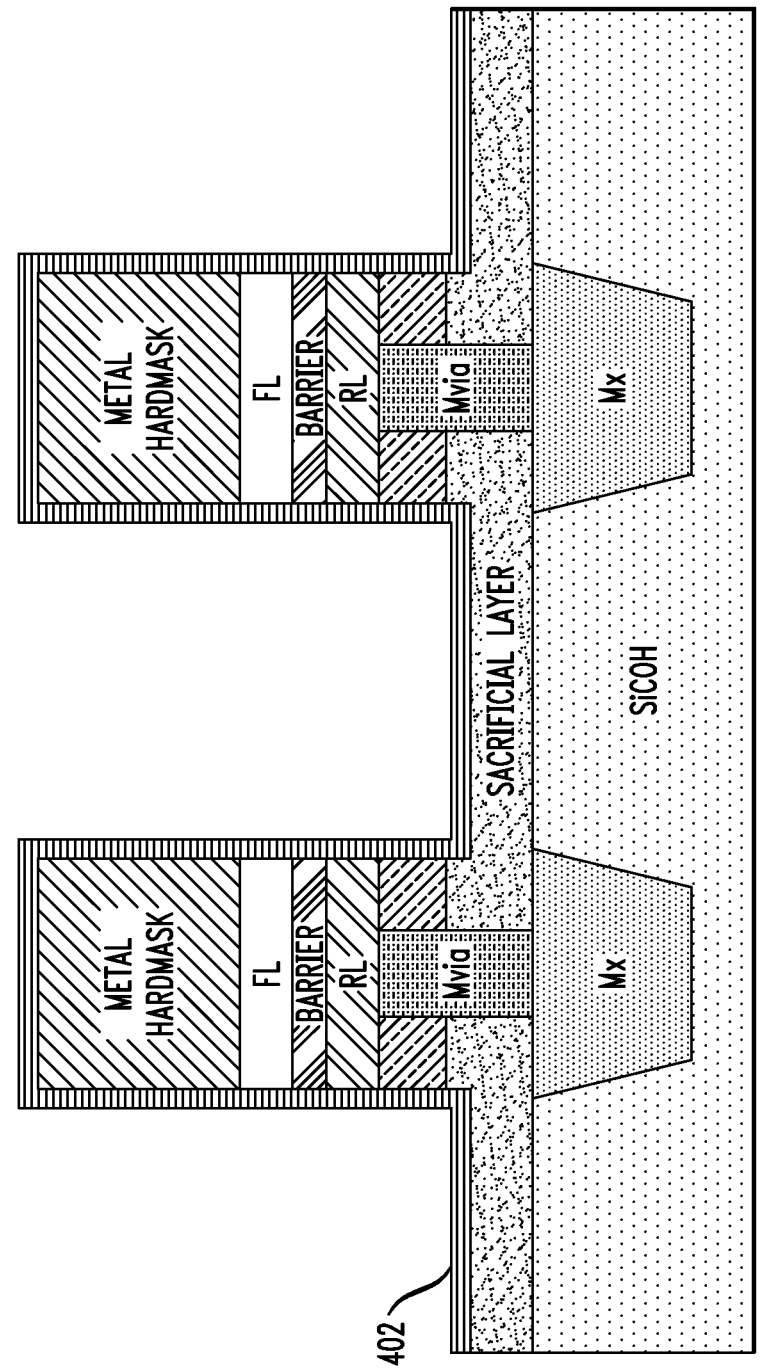

At FIG. 4, MRAM cells 401 are patterned, and an in-situ liner 402 is formed to encapsulate the MRAM cells 401. The patterning can be performed by, for example, an ion beam etching (or milling) (IBE). Note that portions of the sacrificial layer may be lost due to non-selective IBE.

Figure 5:
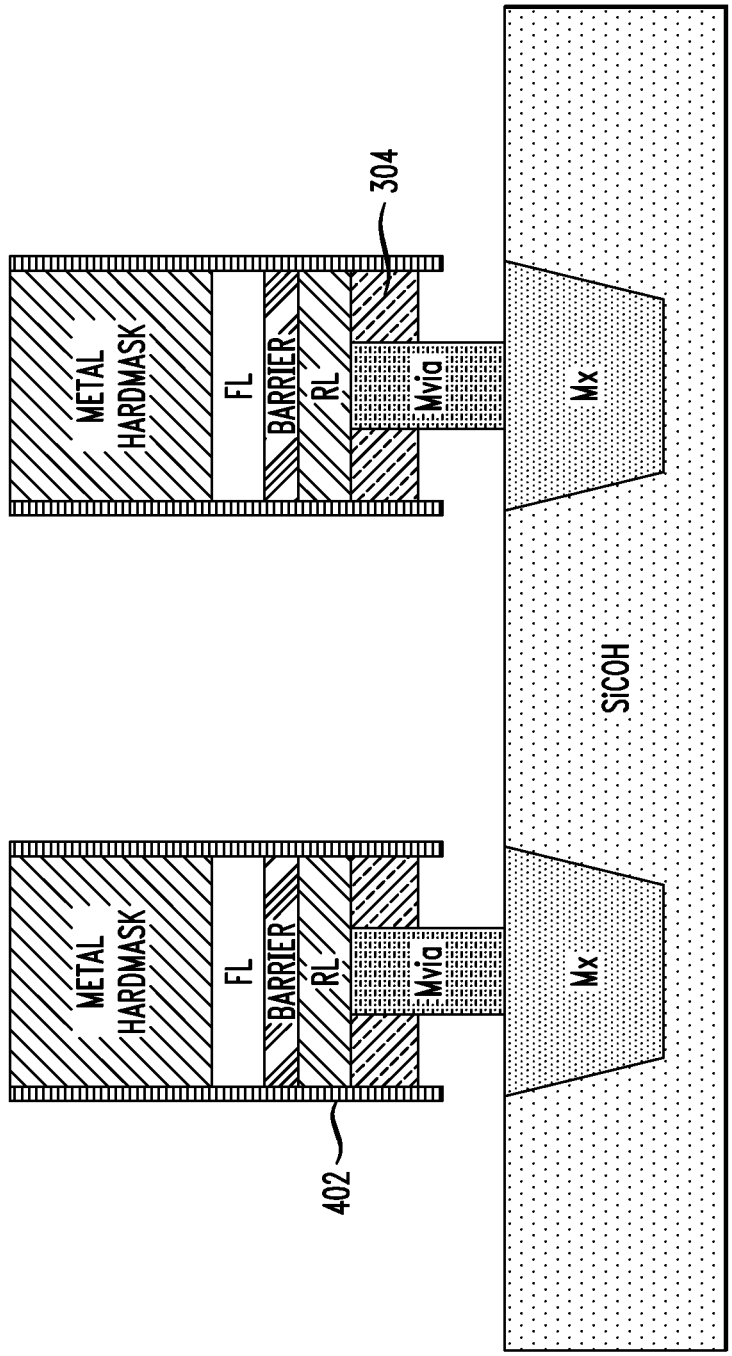

At FIG. 5, the in-situ liner 402 is etched directionally by reactive ion etch (RIE) to remove horizontal portions, and the sacrificial layer is removed. The etched in-situ liner 402 is forms a sidewall spacer extending below a bottom of the dielectric layer 304 (dielectric spacer). The dielectric layer 304 is formed as a toroidal bottom dielectric spacer and protects a bottom surface of the MTJ stack during the removal of the sacrificial layer.

Figure 6:
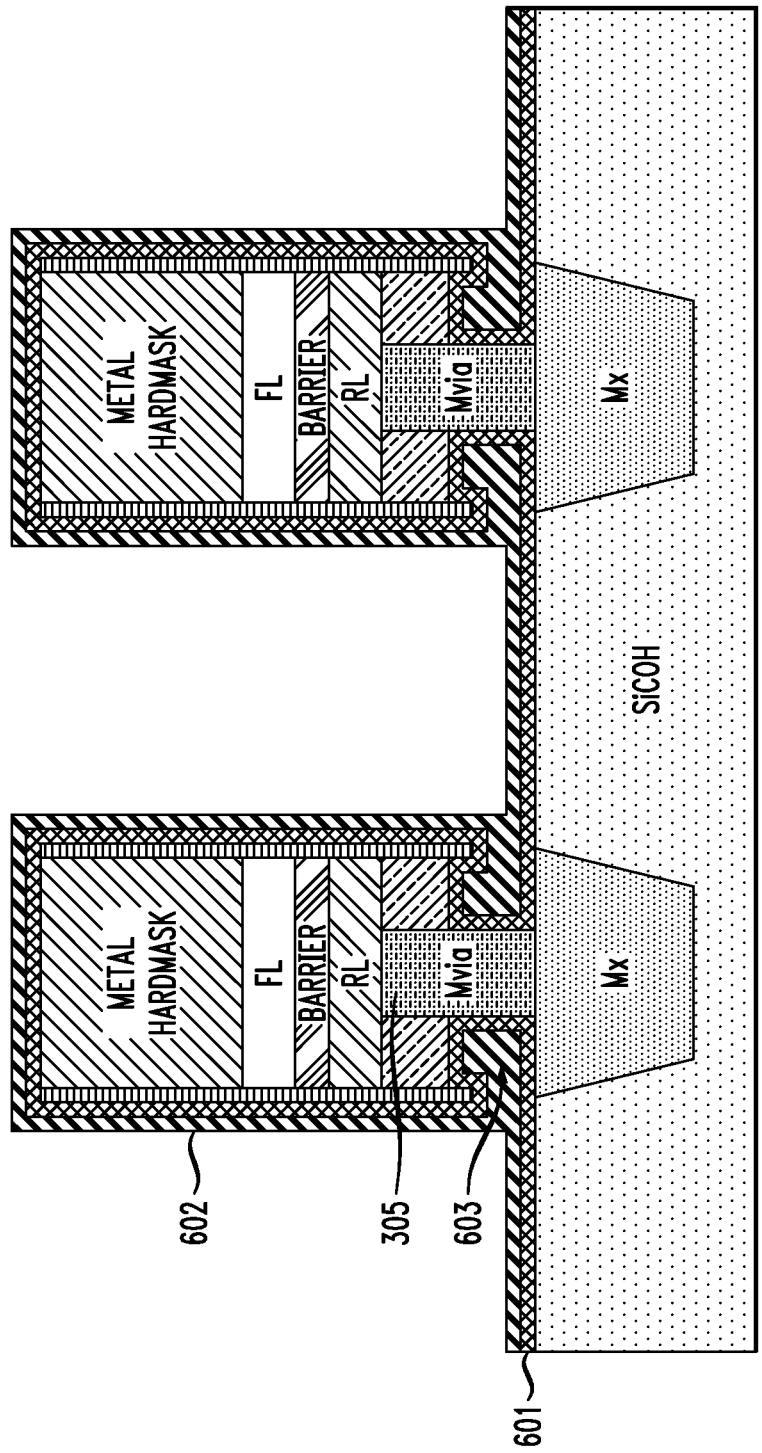
Figure 7:
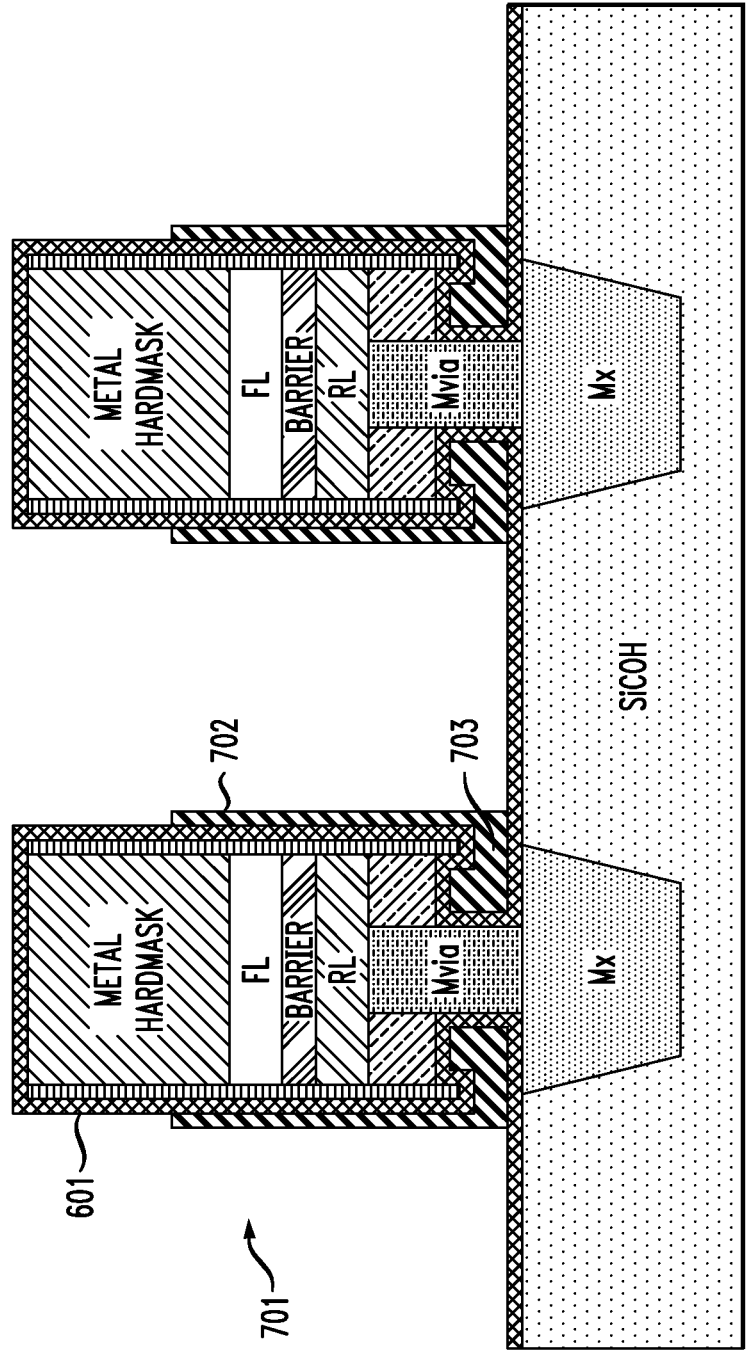

At FIG. 6, a thin conformal dielectric liner 601 is deposited, followed by a conformal heat sink/magnetic shield material 602. The conformal heat sink/magnetic shield material 602 may pinch-off in a sub-MTJ region 603 forming toroidal-shape around a bottom portion of the Mvia 305. The dielectric liner 601 isolates the Mvia 305 during deposition of the conformal heat sink/magnetic shield material 602, preventing chemical interaction between the Mvia 305 and conformal heat sink/magnetic shield material 602. In addition to preventing the chemical interaction, the dielectric liner 601 also prevents electrical connections between the heat sink/magnetic shield material 602 and the bottom MVia. As in FIG. 7, the conformal heat sink/magnetic shield material 602 of FIG. 6 is processed to form a heat shield/magnetic shield 701, for example, by pull-down using a directional RIE. The directional RIE simultaneously forms lateral 702 and bottom 703 heat sinks/magnetic shields. According to embodiments of the present invention, lateral and bottom heat sink/magnetic shield are integrated at the device level. The conformal dielectric liner 601 acts as an etch-stop layer and prevents erosion of the metallic hardmask.

Figure 8:
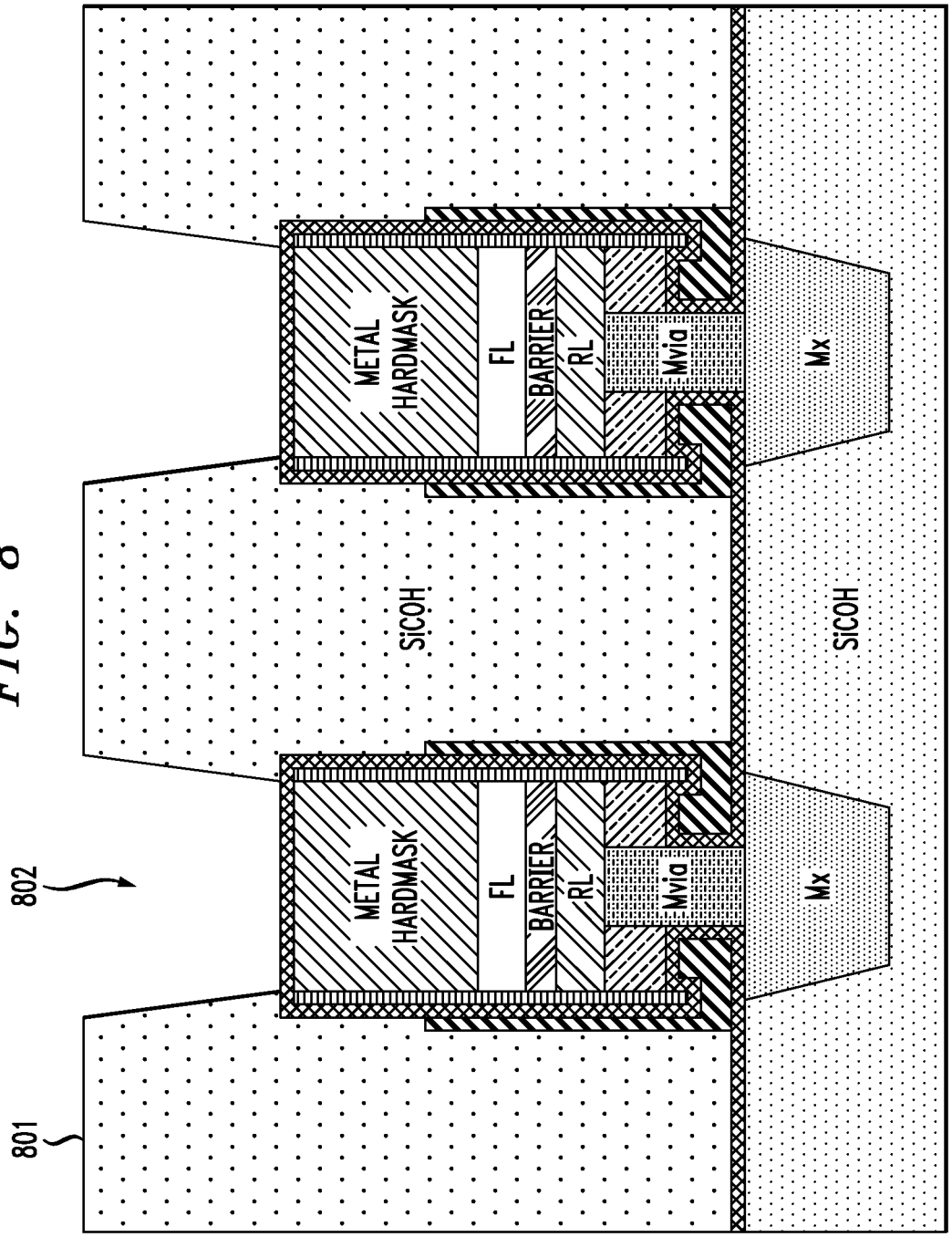
Figure 9:
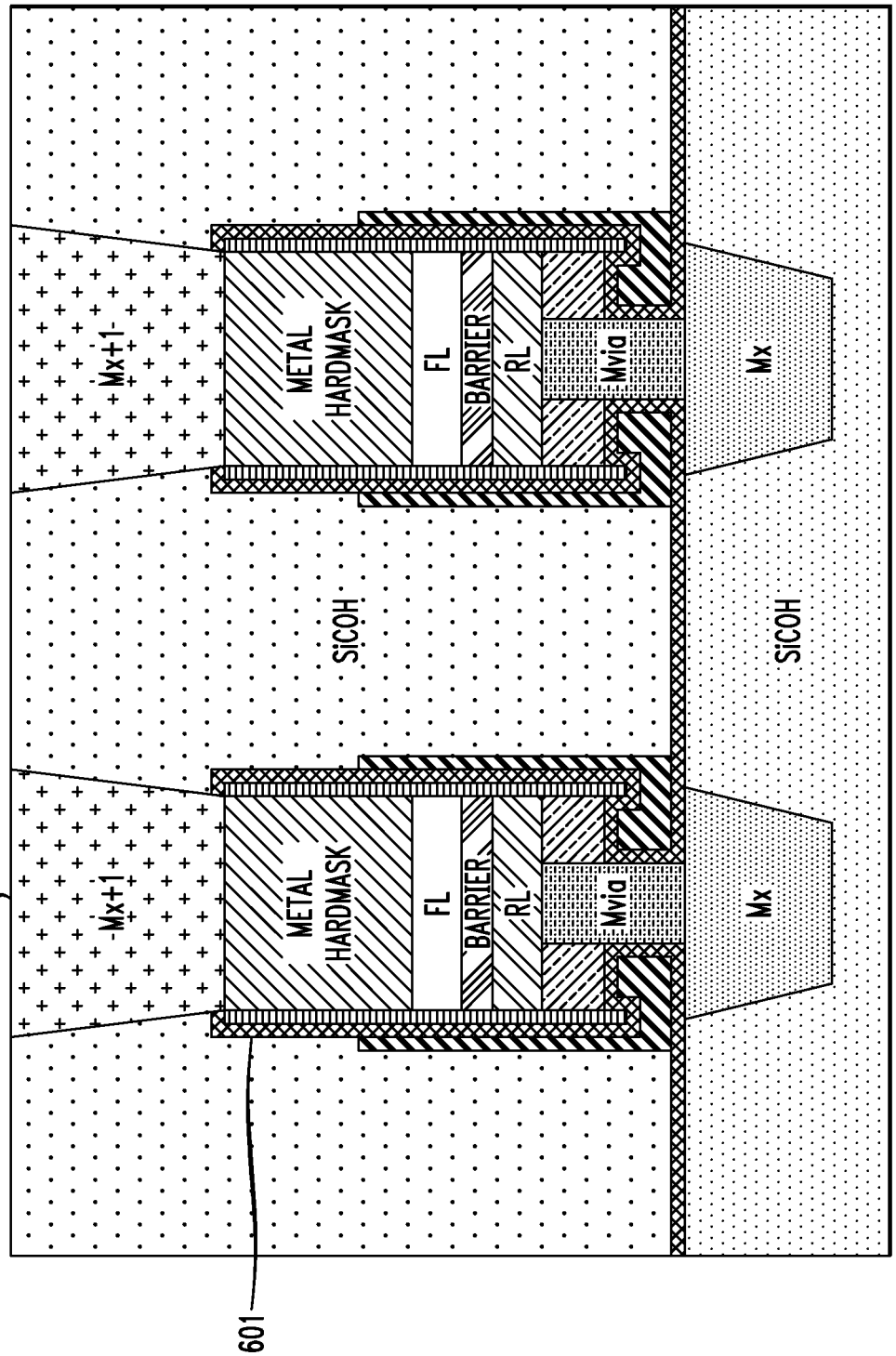
FIG. 9 shows an MRAM device comprising a heat sink and magnetic shielding according to some embodiments of the present invention.

At FIG. 8, an organic silicon layer 801 (e.g., a SiCOH such as Octamethylcyclotetrasiloxane (OMCTS) is deposited and planarized. Vias 802 are opened in the organic silicon layer 801, e.g., by a RIE, over the MRAM stacks, where the conformal dielectric liner 601 (if present) acts as an etch-stop layer. As shown in FIG. 9, a top portion of the conformal dielectric liner 601 is etched, and a top contact 901 is formed, e.g., by metallization.

Figure 10:
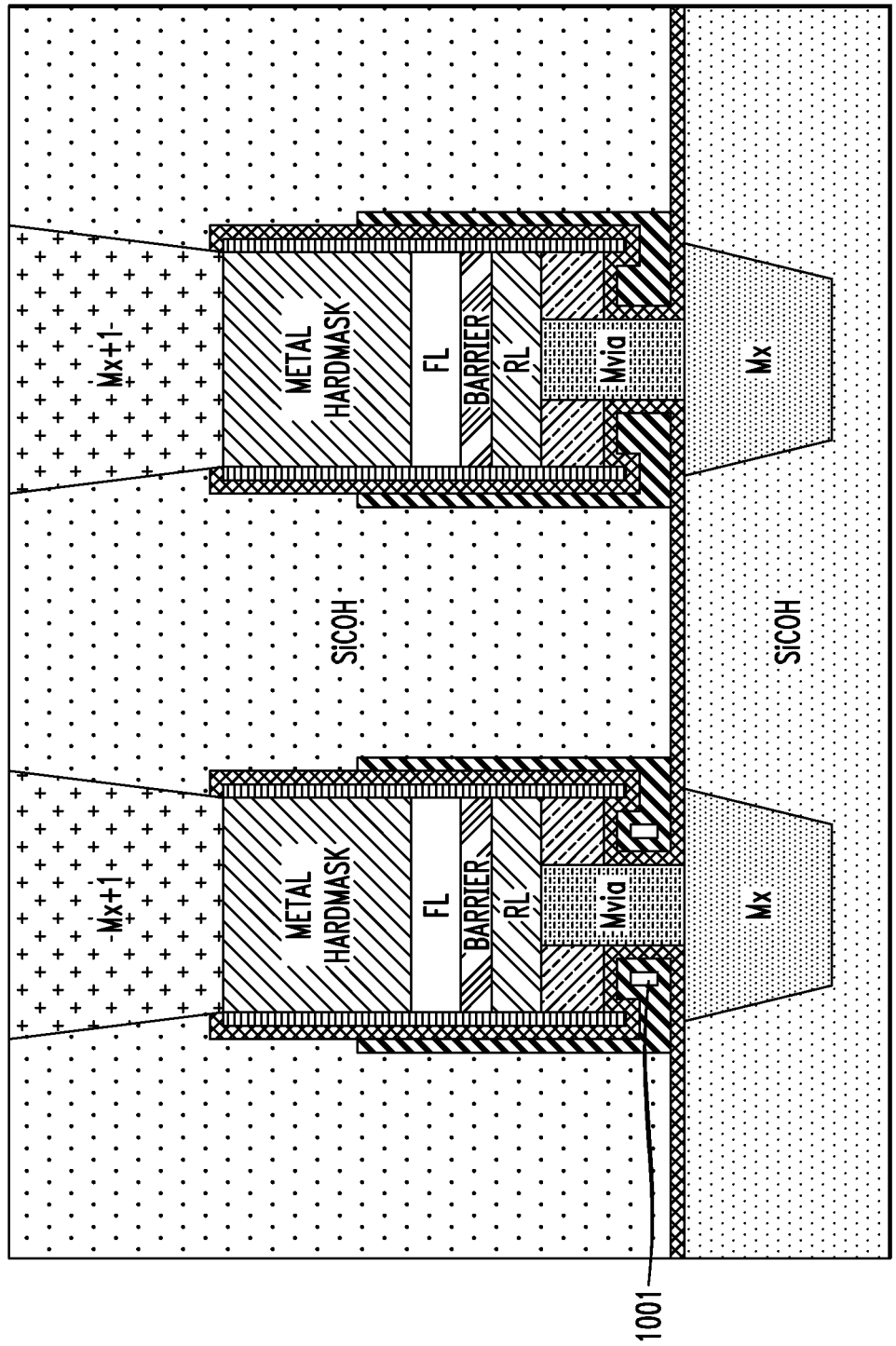
FIG. 10 shows an MRAM device comprising a heat sink and magnetic shielding according to some embodiments of the present invention.

As shown in FIG. 10, a toroidal-shaped air-gap 1001 can be formed around bottom of the MVia, depending on the cavity geometry in the sub-MTJ region.

Figure 11:
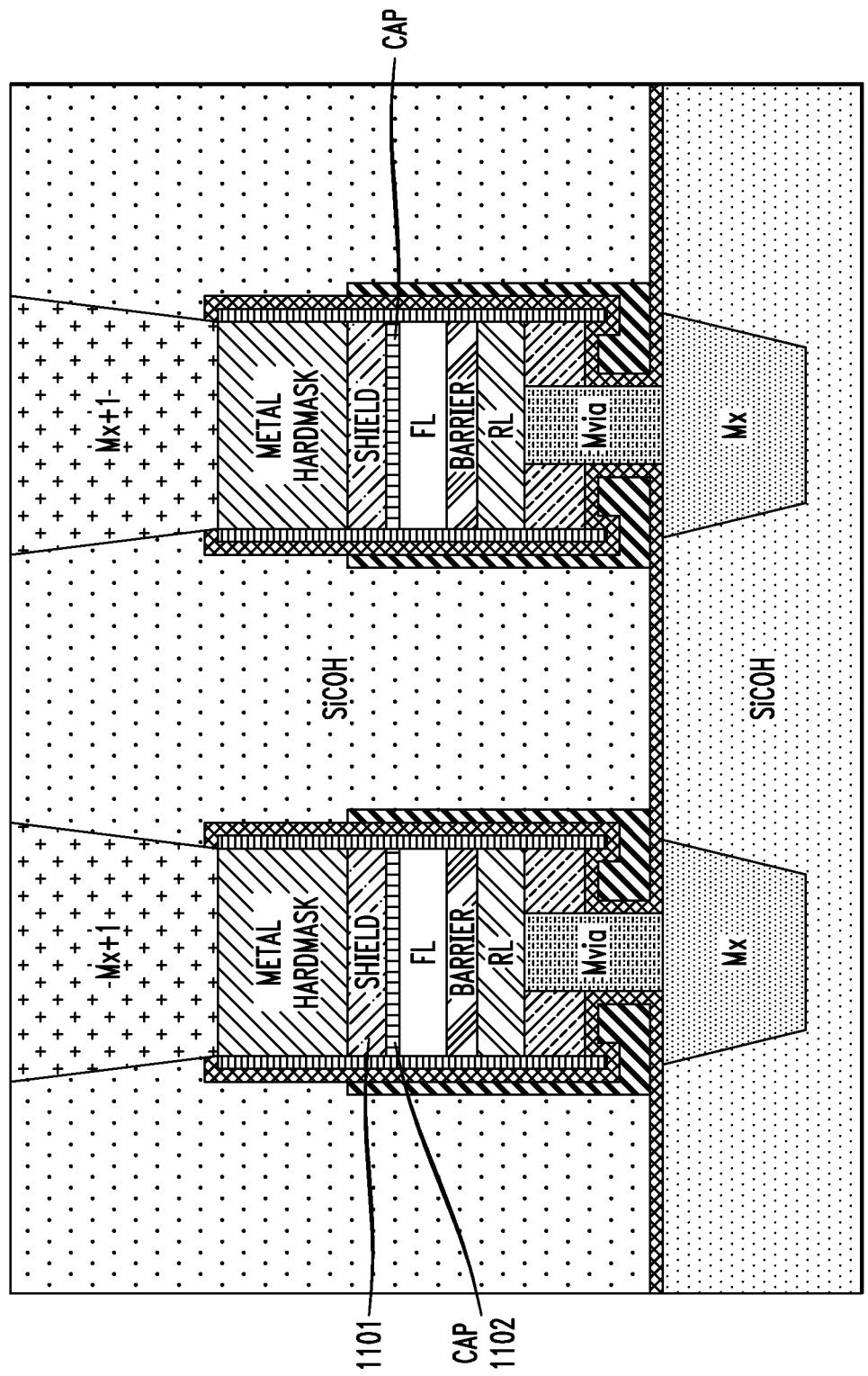
FIG. 11 shows an MRAM device comprising a heat sink and magnetic shielding according to some embodiments of the present invention.

According to some embodiments, top, lateral and bottom heat sink/magnetic shields integrated at the device level. Referring to FIG. 11, the top heat sink/magnetic shield 1101 is integrated on top of the MTJ stack during in-situ PVD deposition (i.e., between the deposition of the MTJ stack layers 306 and the metallic hardmask 307—see FIG. 3). According to at least one embodiment, a cap layer 1102 is formed prior to the top heat sink/magnetic shield 1101.

According to some embodiments, the conformal dielectric liner 601 is omitted (i.e., omitting step/block 108 from FIG. 1). In such a device the heat sink material directly contacts the Mvia and Mx line, resulting in improved heat dissipation. In a device without the conformal dielectric liner 601, there can be a risk of intermixing between the heat sink, the Mvia and the Mx materials.

Figure 12:
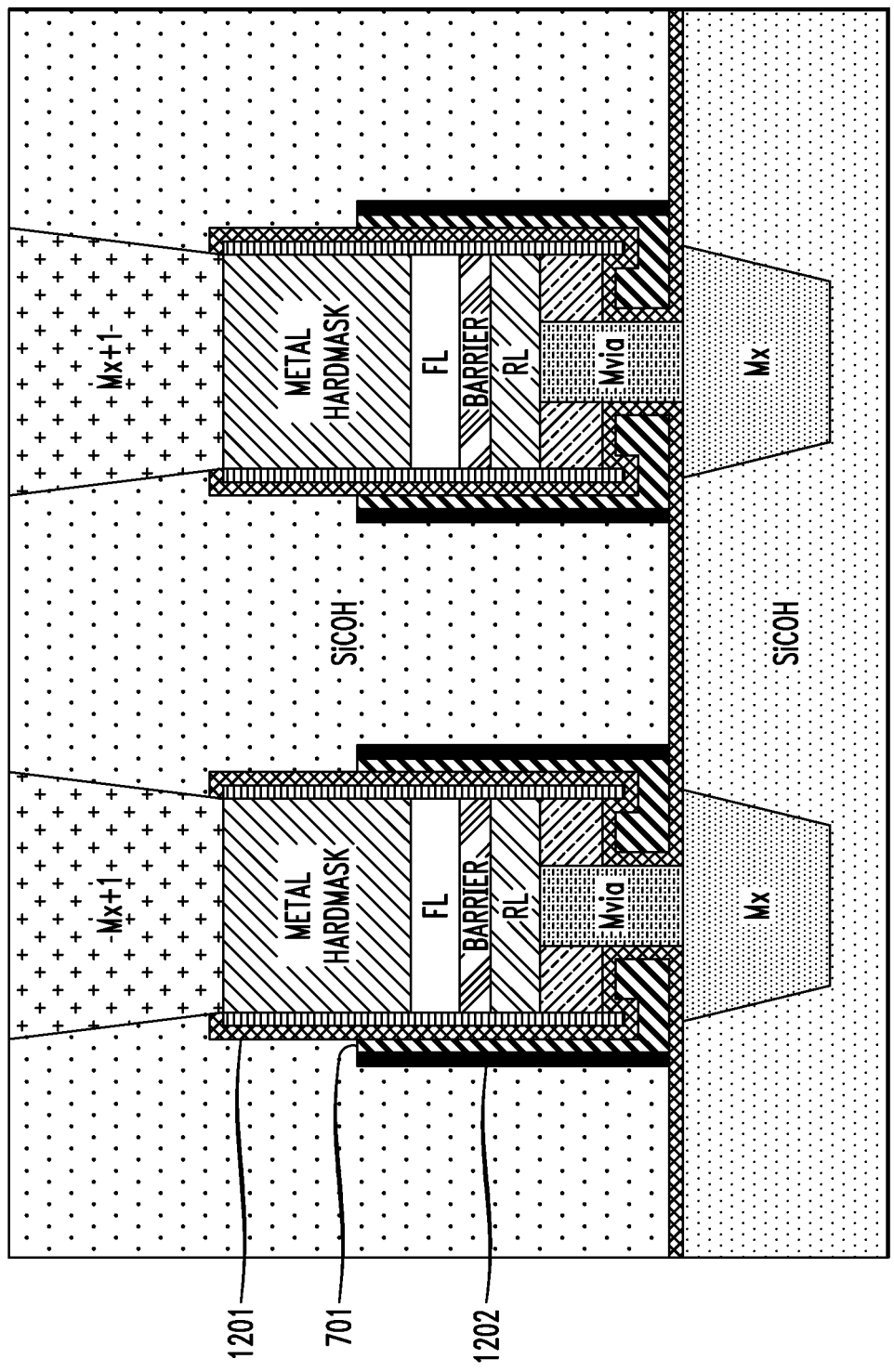
FIG. 12 shows an intermediate structure according to some embodiments of the present invention.

According to embodiments of the present invention and referring to FIG. 1 and FIG. 12, a method 100 for forming a scalable heat sink/magnetic shield for high density MRAM arrays comprises, depositing a second conformal dielectric liner 111 (see also 1201, FIG. 12), and forming a second magnetic shield 112 (see also 1202) by, for example, a conformal deposition of the magnetic shield material and a directional RIE.

According to some embodiments, the second conformal dielectric liner 1201 is omitted (i.e., omitting step/block 111 from FIG. 1). In such a device the second magnetic shield 1202 directly contacts the first magnetic shield.

According to one or more embodiments, the first magnetic shield is formed of Ti or W and provides shielding against radio frequency (RF) magnetic fields above about 100 kHz and the second magnetic shield 1202 is formed of $Ni_{80\%}$ $Fe_{20\%}$ to provide shielding against static or low-frequency magnetic fields.

It should be understood that in the case of embodiments described in connection with FIG. 12, that the top contact formed in block 113 of FIG. 1 includes the deposition and planarization of the organic silicon layer 801 as shown in FIG. 8, the formation of vias 802 in the organic silicon layer 801 over the MRAM stacks, where the conformal dielectric liner(s) 601/1201 (if present) act as an etch-stop layer. As shown in FIG. 9, a top portion of the conformal dielectric liner(s) 601/1201 (if present) are etched, and a top contact 901 is formed, e.g., by metallization. It should be understood that the method of FIG. 1 can include the deposition of either, or both, of the conformal dielectric liner(s) 601/1201, or neither liner.

[Option 1] According to one or more embodiments of the present invention, a heat sink/magnetic shield structure is formed of a high thermal conductivity material, such as Ti, TiN, Cu, Ta, TaN, W, Al, AlN, etc. Magnetic shields are typically used to protect sensitive electronic equipment. The magnetic shield according to embodiments of the present invention provides Faraday shielding (e.g., for RF magnetic fields above about 100 kHz). It should be understood that a Faraday cage operates because an external electromagnetic field causes the electric charges within the cage's conducting material to be distributed so that they cancel the field's effect in the cage's interior. In the case of varying electromagnetic fields, the faster the variations are (e.g., the higher the frequencies), the better the high thermal conductivity material of the magnetic shield resists magnetic field penetration.

According to one or more embodiments of the present invention, a heat sink/magnetic shield structure is formed of a μ-Metal, such as an Ni—Fe soft ferromagnetic alloy with high permeability (~80,000-100,000). Examples of μ-Metals include Permalloy 80 having about 80% Ni and 20% Fe, Supermalloy having above 80% Ni, 12-15% Fe, and 5% Mo, and in some cases small amounts of various other elements such as Si, and a material including about 77% Ni, 16% Fe, 5% Cu and 2% Cr or Mo.

In the case of a heat sink/magnetic shield structure is formed of a μ-Metal, the μ-Metal provides magnetic shielding against static or low-frequency magnetic fields, has low magnetic anisotropy and magnetostriction leading to low coercivity (saturation at low magnetic fields). Further the μ-Metal exhibits low hysteresis losses when used in AC magnetic circuits and high permeability providing a low reluctance path for magnetic flux.

According to some embodiments, μ-metals provide a path for magnetic field lines around the shielded area and thus achieve a magnetic shielding mechanism by leveraging high-permeability.

Further, according to some embodiments the low magnetostriction of the μ-metals is suitable for applications where variable stresses in thin films would otherwise cause large variations in magnetic properties.

According to one or more embodiments of the present invention, a heat sink/magnetic shield structure is formed of a High-Temperature Superconductor (HTS) or Room-Temperature Superconductor (RTS) material. Superconductor materials in their superconductor state exhibit no electrical resistance and expel magnetic flux fields. Examples of superconductor materials include Type-I materials such as Al, Pb, $TaSi_2$, SiC:B, and Type-II materials such as Nb, V, Tc, NbTi, $Nb_3Sn$, FCC C:B, FCC Si:B, High-Tc Cuprate-perovskite ($La_{1.85}Ba_{0.15}CuO_4$, bismuth strontium calcium copper oxide (BSCCO), yttrium barium copper oxide (YBCO) . . . ).

It should be understood that Type-I materials exhibit perfect diamagnetism (i.e., ability to repel magnetic fields), and where superconductivity is lost above a critical field Hc. Type-II materials allow magnetic field penetration, have two critical fields (Hc1 and Hc2), behave as Type-I superconductor below Hc1, exhibit a mix of superconducting-conducting states between Hc1 and Hc2, and loose superconductivity above Hc2.

According to one or more embodiments of the present invention, a heat sink/magnetic shield structure is formed of a HTS or RTS achieves the magnetic shielding using the Meissner Effect, which is an expulsion of a magnetic field from a superconductor during its transition to the superconducting state.

Recapitulation:

According to one or more embodiments of the present invention, a method of manufacturing a heat sink and magnetic shield for a magnetic random access memory (MRAM) array comprises depositing a blanket sacrificial layer on a substrate comprising bottom conductive contacts formed therein 101, depositing a dielectric layer on the blanket sacrificial layer 102, forming a bottom metal via in the blanket sacrificial layer and the dielectric layer, and contacting a top surface of the bottom conductive contacts 103, depositing a magnetic tunnel junction (MTJ) stack 104, depositing a hardmask on the MTJ stack 104, patterning the MTJ stack and the hardmask to form an MRAM device and expose the blanket sacrificial layer by etching the hardmask and the MTJ stack 105, encapsulating the MRAM device and the sacrificial material in a first conformal dielectric liner 106, removing the sacrificial material and horizontal portions of the first conformal dielectric liner, wherein vertical portions of the first conformal dielectric liner are not removed 107, depositing a conformal heat sink/magnetic shield material on the MRAM device the vertical portions of the first conformal dielectric liner, exposed sidewall portions of the bottom metal via and the substrate 109, and performing a directional etch removing an exposed upper portion of the conformal heat sink/magnetic shield material to form, simultaneously, a lateral and bottom heat sink/magnetic shield around a portion of the MRAM device 110.

According to one or more embodiments of the present invention, a magnetic random access memory (MRAM) array includes a plurality of MRAM cells 401, each of the MRAM cells including a magnetic tunnel junction (MTJ) stack disposed on a bottom metal via 305 and connecting the MTJ stack 306 to a bottom conductive contact 302 in a substrate 301, and a unitary heat sink/magnetic shield 701 disposed on a vertical portions of each of the the MRAM cells 401, including vertical portions of the bottom metal vias 305, and under a portion of each of the MTJ stacks.

Furthermore, it should be noted that any of the methods described herein can include an additional step of providing a computer system controlling appropriate processing machinery to implement a method 100 for forming a scalable heat sink and magnetic shielding for high density MRAM arrays. Further, a computer program product can include a tangible computer-readable recordable storage medium with code adapted to be executed to carry out one or more method steps described herein, including the provision of the system with the distinct software modules.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetic random access memory (MRAM) array comprising:
    a plurality of MRAM cells, each of the MRAM cells comprising a magnetic tunnel junction (MTJ) stack disposed on a bottom metal via connecting the MTJ stack to a bottom conductive contact in a substrate;
    a plurality of top conductive contacts, each of the top conductive contacts disposed on a respective one of the MTJ stacks; and
    a plurality of unitary structures configured as a heat sink and magnetic shield disposed on a vertical portions of each of the MRAM cells, including vertical portions of the bottom metal vias, and under a portion of each of the MTJ stacks.

2. The MRAM array of claim 1, wherein each of the unitary structures wraps entirely around a respective one of the MRAM cells and has a height recessed below a height of a metal hardmask disposed on the MTJ stack and above a top of the MTJ stack.

3. The MRAM array of claim 1, wherein each of the MRAM cells further comprises a toroidal bottom dielectric spacer in contact with bottom surface of the MTJ stack and formed around a top portion of the bottom metal via.

4. The MRAM array of claim 1, wherein each of the MRAM cells further comprises a vertical sidewall spacer disposed on the vertical portions of the MRAM cell and extending below a bottom of a dielectric spacer formed on a lower surface of the MTJ stack.

5. The MRAM array of claim 1, wherein each of the unitary structures comprises an air-gap around the bottom metal via.

6. The MRAM array of claim 1, further comprising a top heat sink/magnetic shield formed on over the MTJ stack.

7. The MRAM array of claim 1, wherein each of the unitary structures is isolated from the MTJ stack by a vertical sidewall spacer and a toroidal bottom dielectric spacer.

8. The MRAM array of claim 1, further comprising a first conformal dielectric liner disposed on the MRAM cells, exposed portions of the bottom metal vias, the bottom conductive contacts and the substrate, wherein the first conformal dielectric liner is further disposed under the unitary structures.

9. The MRAM array of claim 8, further comprising a second magnetic shield disposed on a portion of the conformal unitary structures.

10. The MRAM array of claim 9, wherein the unitary structures exhibit a pinch-off below the MTJ stack.

11. The MRAM array of claim 8, further comprising a second conformal dielectric liner disposed on the unitary structures and exposed portions of the first conformal dielectric liner.

12. The MRAM array of claim 11, further comprising a second magnetic shield disposed on a portion of the second conformal dielectric liner.

* * * * *